United States Patent [19]
Adler

[11] Patent Number: 5,532,550
[45] Date of Patent: Jul. 2, 1996

[54] ORGANIC BASED LED DISPLAY MATRIX

[76] Inventor: Robert Adler, 327 Latrobe, Northfield, Ill. 60093

[21] Appl. No.: 175,844

[22] Filed: Dec. 30, 1993

[51] Int. Cl.$^6$ ..................................... H01J 1/62
[52] U.S. Cl. ............................. 313/500; 345/82
[58] Field of Search .................... 313/500, 504, 313/505; 427/66; 228/180.2, 180.1; 315/169.3

[56] References Cited

U.S. PATENT DOCUMENTS

| | | | |
|---|---|---|---|
| 4,488,781 | 12/1984 | Giglia | 359/271 |
| 4,614,668 | 9/1986 | Topp et al. | 427/66 |
| 4,693,770 | 9/1987 | Hatada et al. | 156/151 |
| 4,853,296 | 8/1989 | Fukuyoshi | 428/623 |
| 4,862,153 | 8/1989 | Nakatini et al. | 345/80 |
| 4,867,371 | 9/1989 | Davis et al. | 228/160 |
| 4,933,601 | 6/1990 | Sagawa et al. | 313/500 |
| 4,937,707 | 6/1990 | McBride et al. | 361/751 |
| 4,999,539 | 3/1991 | Coovert et al. | 313/505 |
| 5,059,862 | 10/1991 | VanSlyke et al. | 313/503 |
| 5,133,495 | 7/1992 | Angulas et al. | 228/180.1 |
| 5,276,380 | 1/1994 | Tang | 313/504 |
| 5,293,006 | 3/1994 | Yung | 174/261 |
| 5,323,084 | 6/1994 | Haitz | 313/500 |
| 5,346,718 | 9/1994 | Thorgersen et al. | 427/66 |

OTHER PUBLICATIONS

"Bright Opportunity" pp. 126, 128 *Scientific American*, May 1993.

"Bright Organic Electroluminescent Devices With Double-Layer Cathode" pp. 1342–1344, IEEE Transactions on Electron Devices, vol. 40 #7.

Primary Examiner—Donald J. Yusko
Assistant Examiner—Lawrence O. Richardson
Attorney, Agent, or Firm—Roland W. Norris

[57] ABSTRACT

An electroluminescent display is formed from a matrix of organic based light emitting diodes (LEDs) backed by an array of low resistance, high amperage conductors joined to the LED matrix at many points, in order to ensure low voltage drops along each line in line-at-a-time operation of the display. A method of joining the current carrying conductors to the matrix so as not to disturb the LED assembly through mechanical stress is also disclosed.

7 Claims, 1 Drawing Sheet

ORGANIC BASED LED DISPLAY MATRIX

BACKGROUND

The present invention relates generally to electroluminescent (EL) display devices and particularly to EL displays comprised of a matrix of organic based light emitting diodes (LEDs) such as may be found in class 313/503, 504.

In recent years, several papers have appeared dealing with light emitting diodes in which the conventional semiconductor junction is replaced by one or two films made of organic materials. In some cases these materials are crystalline; in others they are polymers. A device of the latter type was described in the *IEEE Transactions on Electron Devices*, vol. 40, no. 7, July 1993. FIG. 1 illustrates the type of device discussed in the cited paper.

As seen in FIG. 1, the substrate 3 is a glass plate coated with a transparent layer of indium-tin oxide (ITO) 4 for the anode. The ITO anode has an electrical sheet resistance of ten ohms per square. First and second thin film organic layers of polymers 5, 6, designated TPD and Alq (see the original paper for chemical data), each forty nanometer thick, were successively deposited in vacuum. This was followed by a metal layer 7 serving as the cathode; in some experiments fifty nanometers of magnesium were used, in later experiments one nanometer of lithium. Finally, two-hundred nanometers of silver 8 were deposited on top of the magnesium or lithium layer to protect it from the atmosphere and serve as a cathode contact. After all the vacuum deposition procedures were completed the device was operated at room temperature and in the open atmosphere.

A maximum brightness of 15100 candelas (cd) per square meter was produced at a current density of 330 mA per square centimeter, with eighteen volts applied to the cell. When the Alq layer 6 was doped with coumarin, an organic dye, the brightness increased drastically to 40400 cd/square meter, without any significant change in electrical characteristics. The light output from the device in this last-mentioned condition was about twelve cd/ampere.

As might be expected, there has been considerable speculation about possible application of organic film diodes to flat panel displays for computers and for television. For example, an article on page 126 of the May 1993, *Scientific American* discusses that possibility in some detail. At first glance, it would appear that the new diodes would make the construction of flat panel matrix displays easy. The films are well suited to being deposited on flat substrates; large size panels seem possible because no single crystal wafers are involved; no vacuum spacers are needed as in field emission displays, and no critical distances need be maintained as in liquid crystal panels. Because diodes are inherently non-linear, there is no need for an .active matrix. Finally, operating voltages are low.

A flat panel, according to a simple extrapolation of the existing art, would merely require extending the light emitting films shown in FIG. 1 over a much larger surface. The light emitting films might well be made continuous across the entire area, while the conducting layers, i.e. ITO for the anode and metal layers for the cathode, would be subdivided into vertical and horizontal strips, respectively, to form the desired matrix.

However, there is a problem inherent in the design of a large matrix made up of light-emitting film diodes. It is this problem which the present invention addresses.

The figures quoted above, 40400 cd/square meter at 330 mA/square cm, represent a light/current ratio of about 12 candelas per ampere, a figure high enough to be of practical interest. The light is in the green portion of the spectrum which is the most visible. Let us examine the case of a panel with a 30 inch (76 cm) diagonal, having the conventional aspect ratio of 4:3.

The best known procedure for addressing a matrix of light emitting diodes is called "one-line-at-a-time". This means that if the matrix, for example, contains 480 horizontal rows or lines, only one of these rows is made to produce light at any given instant. If there are, for example, 640 pixels in each row, separate signals are applied simultaneously to each of 640 vertical conductors in order to produce the desired light intensity distribution in the particular row which is active at that instant. After a predetermined time interval, the selected row is turned off and the next row is turned on; each row has a duty factor (time on, divided by the total time) of one part in 480. It can be seen that each row is emitting light during only one part in 480 of the total time; so, if the luminance during that brief interval is 40400 cd per square meter, the time-averaged luminance as seen by a human observer is 40400 divided by 480, or 84 cd/square meter, equivalent to 25 footlamberts.

The area occupied by one horizontal row equals the total panel area (0.28 square meter) divided by the number of rows (480), or 5.83 square cm. Assuming that all pixels in the row are turned on, that row consumes an instantaneous current of 5.83 times 330 mA, or approximately two amperes. With the panel fully lighted, these same two amperes are switched in turn from row to row.

When one particular row is fully lighted, each pixel draws 1/640 of the total current, or about 3 mA, through its corresponding vertical conductor. Let us assume that the drive signals are applied to these conductors near the bottom of the panel. If the vertical conductors consisted only of ITO with 10 ohms per square, the series resistance of each conductor would vary from just a few ohms for a pixel in the bottom row to more than 5000 ohms for a pixel in the top row. At 3 mA, the latter figure would require an extra drive voltage of 15 volts, which is unacceptable; in practice, the voltage drop in the vertical conductor should not exceed 0.3 volt, which calls for vertical conductors having a resistance of no more than 100 ohms.

Let us now turn to the horizontal conductors. Assuming that the horizontal rows receive their drive power from the right edge of the panel, each horizontal conductor must be capable of carrying the full current of about 2 amperes and passing it from pixel to pixel without a significant voltage drop. As each pixel takes its share, about 3 mA, the current in the horizontal conductor decreases linearly from right to left, reaching zero at the left end. The brightness of each pixel is a strong function of the voltage applied to it; to prevent detrimental brightness changes from right to left, the voltage drop along the horizontal conductor should be kept to a small fraction of one volt. This is particularly important because any significant voltage drop caused by turned-on pixels on the right side of a row will reduce the brightness of all pixels on the left side of the same row. Thus, bright objects extended along the right half of the screen will produce conspicuous shadows to the left.

In a fully lighted row, as previously mentioned, the current in the horizontal conductor decreases linearly from its full value at one edge to zero on the other. The total voltage drop is therefore one-half the maximum current times the resistance of the conductor. A resistance of, for example, 0.2 ohms with a peak current of 2 ampere would give a maximum voltage drop of 0.2 volt which is acceptable. To achieve this low voltage drop a ribbon of copper, for example, 0.5 mm wide, 0.125 mm thick having a length equal to the width of the panel (61 cm) and having a resistance of about 0.17 ohms at room temperature would be suitable. It is evident, however, that a conductive ribbon of such thickness (125 um) cannot economically be formed by metal evaporation, the preferred method for preparing the thin film conducting layers shown in FIG. 1 or overlaid indelicately on the fragile LED thin film substrate.

The above discussion makes it clear that in a matrix type television display made up of light emitting diodes, the conductance requirements for vertical and horizontal conductors differ by at least three orders of magnitude, and, therefore, different manufacturing techniques are required for each type.

OBJECTS OF THE INVENTION

It is the object of the invention to supply a matrix display made up of light emitting film diodes with the high instantaneous line currents required by line-at-a-time operation while minimizing the voltage drop produced by such currents.

It is a further object of the invention to provide low resistance conductors external to the diode matrix in order to carry said currents along the matrix, and to further provide means for connecting said low resistance conductors electrically to the line conductors in the matrix by establishing bridging connections between said low resistance conductors and said line conductors at a plurality of points.

It is an additional object of the invention to establish said bridging connections by a method which avoids the application of mechanical stress to the diode matrix and which lends itself to economical quantity manufacture.

According to one embodiment of the invention, ribbons of copper or other highly conducting metal are provided on a substrate separate from the diode substrate to interconnect the pixels in each row, or to augment such interconnection if it already exists on the panel. If the pixels within each row are already interconnected, for example by a vacuum-deposited silver strip, then it is not essential for the copper ribbon to make electrical contact with each pixel; the important consideration is to keep the voltage drop to a small fraction of one volt. This can be achieved by means of multiple conducting bridges formed between the copper ribbon and the silver strip, the bridges being spaced from each other by distances small enough to render the voltage drop in the short portions of silver strip between two such bridges insignificant.

BRIEF DESCRIPTION OF THE DRAWINGS

Other attendant advantages will be more readily appreciated as the invention becomes better understood by reference to the following detailed description and compared in connection with the accompanying drawings in which like reference numerals designate like parts throughout the figures. It will be appreciated that the drawings may be exaggerated for explanatory purposes.

DESCRIPTION OF THE PREFERRED EMBODIMENT

Figure 1:
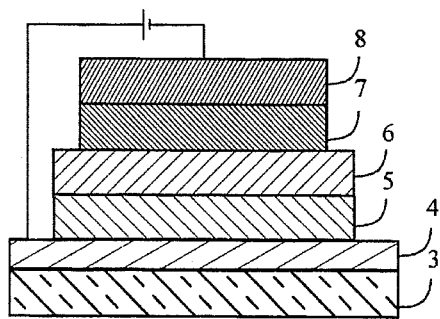
FIG. 1 is a side view of a known organic LED.
Figure 2:
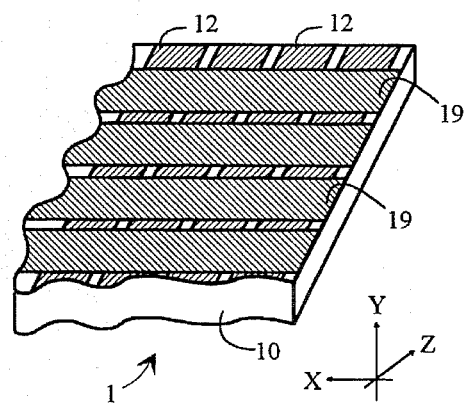
FIG. 2 is a perspective cut-away view of an LED matrix array portion of the present invention.
Figure 3:
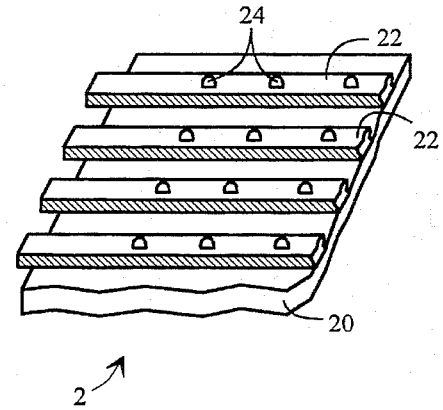
FIG. 3 is a perspective cut-away view of the cathode current carrying portion of the present invention.

FIGS. 2 and 3 illustrate a preferred embodiment of the invention. In FIG. 2, a first component 1 consists of a transparent plate 10, preferably of glass, with a matrix of light emitting film diodes thereon, as represented by the conductive strips of the matrix, i.e. cathode strips 19 and anode strips 12 arranged orthogonally to each other. The remaining components lie between the cathode and anode strips in accordance with FIG. 1, but are omitted for the purpose of drawing clarity. Note that only a corner of the first component 1, including four cathode strips 19, is shown. It will be understood that the actual component 1 may be about a hundred times larger in both height and width.

As shown in FIG. 3, a second component 2 is made up of a dielectric backing plate 20 which may also be glass and which carries a plurality of parallel copper ribbons 22 in mechanical alignment with the LED matrix, i.e., the ribbons 22 having substantially the same spacing as that of the cathode strips 19, such that each cathode strip can be electrically energized by one ribbon 22. The copper ribbons are preferably, but not necessarily, firmly attached to the second glass plate 20, for example by means of cement. If the backing plate is not needed for structural rigidity, releasable adhesive can be used. Alternatively, the ribbons might be suspended from a frame, thus eliminating the need for adhesive. Each, copper ribbon 22 carries many small balls 24 of fusible metal. These balls 24 are preferably spaced at regular intervals which correspond to the horizontal spacing of the columns of vertical anode strips 12 in the matrix.

Figure 4:
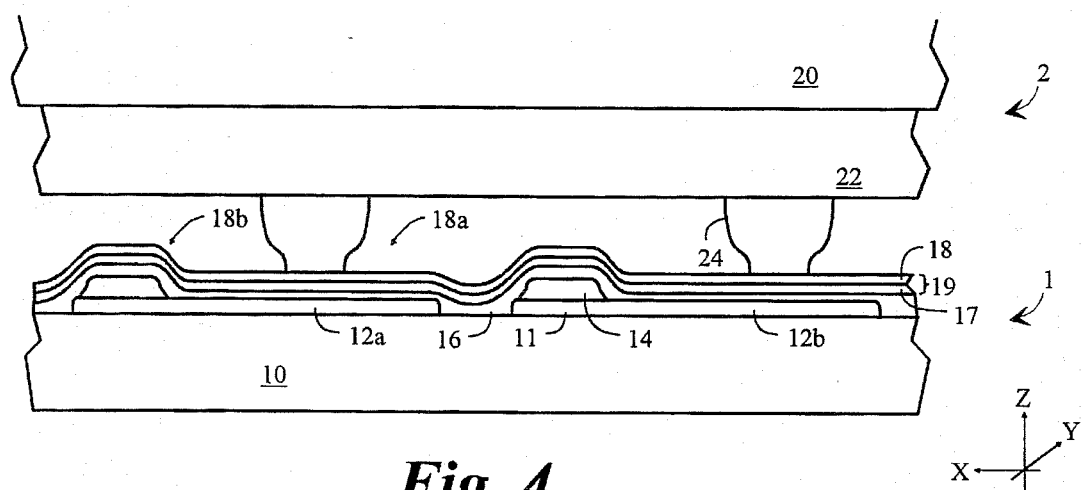
FIG. 4 is an enlarged cut-away view of portions of FIGS. 2 and 3 joined together to comprise an embodiment of the present invention.

FIG. 4 is a cross-sectional view which shows how first and second components 1 and 2 are assembled. For the sake of clarity, vertical dimensions are greatly exaggerated. As is evident from FIGS. 2 and 3, component 2 is turned upside down and placed on top of component 1. Only two pixels, i.e. junctions of anode strips 12a, 12b and cathode strip 19, adjacent to each other along a horizontal row, are illustrated. As the pixel construction is identical for each, the construction will be described in the singular. The first layer deposited as an anode on glass plate 10 is ITO layer 11. In forming the matrix display, this ITO layer 11 is not continuous; it consists of parallel strips, each strip corresponding to a vertical anode column 12. Therefore, the two horizontally adjacent pixels shown in FIG. 4 are connected to separate anode ITO strips 12a, 12b. A highly conductive strip 14, e.g., silver or copper about 150 um wide but only 0.8 um thick, runs along the ITO strip 12b to provide a vertical conductor of low series resistance of about 70 ohms on the above cited 30 inch panel. The voltage drop for a pixel in the top row drawing the full 3 mA is only 0.21 volt. The polymer film or pair of films 16 is deposited over the ITO strip 12b and anode conductor strip 14. Finally, the cathode layer 19, consisting of a thin magnesium or lithium layer 17 and a thicker silver protective layer 18 is deposited over the polymer film 16. Cathode layer 19, in forming a part of the display matrix, is not continuous, but as seen in FIG. 2, consists of horizontal strips 19, one for each row of pixels.

Fusible balls 24 make contact between copper ribbons 22 and the cathode layer strips 19. Preferably, the fusible balls 24 are spaced at the same intervals as the anode strips 12, and are placed in such a way that they make contact with the flat portion 18a of the protective layer 18 rather than with the curved portion 18b located where cathode strips 18 cross over vertical anode conductor strips 14. This precaution minimizes the probability of accidental shorts due to mechanical defects in the polymer layer.

Fusible balls 24 are preferably made of indium or of a low-melting alloy such as tin/lead or indium/lead. The technique of using fusible balls to establish multiple electrical connections between two hard objects while avoiding mechanical stress is well known in other arts. It is, for instance, used to attach silicon integrated circuit chips to metalized patterns on glass, and the method is often referred to as flipchip technology.

It is by no means necessary to establish an electrical connection between the copper ribbon 22 and the cathode protective layer 18 at every anode strip 12. Depending on the thickness of the cathode protective layer 18, one or several anode strips may be skipped, so long as the voltage drop in the cathode strip 19 does not exceed a small fraction of one volt. Conversely, if connections are more closely spaced than is really necessary, the failure of an occasional fusible ball connection will not produce any significant voltage drop, with the result that the defect will not be visible in the picture.

Throughout this specification it has been assumed that in the operation of the matrix display the conventional line-at-a-time sequence is followed, and that the line which is turned on at a given instant is a horizontal row. It will be evident to one skilled in the art that the same principles apply if the roles of horizontal rows and vertical columns are interchanged, or if other orthogonal pairs such as diagonal lines are substituted. Whenever a two-dimensional raster of light emitting diodes is scanned in such a way that at a given instant just one line is energized, whether that line is horizontal, vertical or diagonal, a high current must be supplied to it with negligible voltage drop, and that requires a conductor of very low resistance. The invention provides such a low-resistance conductor and means for connecting it to the matrix.

While the present invention has been illustrated and described in connection with the preferred embodiments, it is not to be limited to the particular structure shown, because many variations thereof will be evident to one skilled in the art and are intended to be encompassed in the present invention as set forth in the following claims.

What is claimed is:

1. An electroluminescent display panel, comprising:
   I. a thin film light emitting diode matrix comprising row conductors and column conductors
      A) a transparent substrate;
      B) a series of thin film, transparent anode strips affixed to the transparent substrate and oriented in a first longitudinal direction;
      C) a series of thin film, low resistance conductor strips, the conductor strips oriented in the first longitudinal direction and in electrical contact with the anode strips;
      D) a luminescent film overlying the anodes and the conductors;
      E) a series of thin film cathode strips overlying and in electrical contact with the luminescent film, the cathode strips being oriented in a second longitudinal direction orthogonal to the first longitudinal direction; and
   II. a high amperage, low resistance, current device having:
      a nonconductive backing plate having attached thereto a series of low resistance, high amperage conductors, each conductor of sufficient length and cross section to carry an amount of current necessary to supply an entire cathode strip without incurring a brightness depleting voltage drop with a spacing equal to that of the cathode strips and oriented in the second longitudinal direction; and
   III. means for electrically connecting each of the high amperage conductors to one of the cathode strips at a plurality of points along the high amperage conductors without mechanically stressing the light emitting diode matrix so as to pair a plurality of the high amperage conductors to a plurality of the cathode strips without causing a disruption of the light emitting diode matrix.

2. An electroluminescent display panel, comprising
   I. a thin film light emitting diode matrix comprising
      A) a transparent substrate;
      B) a series of transparent anode columns affixed to the transparent substrate and oriented in a first longitudinal direction;
      C) a luminescent film overlying the transparent anode strips;
      D) a series of cathode rows overlying and in electrical contact with the luminescent film, the cathode rows being oriented in a second longitudinal direction orthogonal to the first longitudinal direction; and
   II. a high amperage, low resistance current device having:
      a series of low resistance, high amperage conductors with spacings equal to that of the cathode rows and oriented in the second longitudinal direction; and
      a mechanical support means for the low resistance conductors, the mechanical support means being separate from the light emitting diode substrate; and
   III. means for electrically connecting each of the high amperage conductors to one of the cathode rows at a plurality of points without mechanically stressing the light emitting diode matrix so as to pair a plurality of the high amperage conductors to a plurality of the cathode rows without causing a disruption of the light emitting diode matrix.

3. The electroluminescent matrix forming a display device according to claim 2, wherein the mechanical support means further comprises:
   a nonconductive backing plate having affixed thereto the series of low resistance, high amperage conductors.

4. The device according to claim 2 wherein the means for electrically connecting the conductors to the cathode rows comprises a linear array of connection points along each conductor.

5. The device according to claim 2 wherein the means for electrically connecting the conductors to the cathode rows comprises fusible metal balls located intermittently along the conductors.

6. The device of claim 5 wherein the fusible metal balls are made of indium.

7. A method of constructing an electroluminescent diode matrix display device, the method comprising:
   A) providing a first transparent substrate;
   B) affixing a series of transparent anodes in a first longitudinal direction onto said transparent substrate;
   C) overlaying the anodes with a light emitting diode film;
   D) covering the film with a series of cathode strips, the cathode strips being oriented in a second longitudinal direction orthogonal to the first longitudinal direction;
   E) providing a separate nonconductive mechanical support means;

F) attaching to the support means a series of low resistance, high amperage conductors equal in number to the cathode strips and oriented in the second longitudinal direction; and G) connecting each of the low resistance, high amperage conductors to one of the cathode strips at a plurality of points without mechanically stressing the cathode strips so as to pair a plurality of the high amperage conductors to a plurality of the cathode strips.

* * * * *